US008889565B2

(12) United States Patent
Noiray et al.

(10) Patent No.: US 8,889,565 B2
(45) Date of Patent: Nov. 18, 2014

(54) SELECTIVE REMOVAL OF OXYGEN FROM METAL-CONTAINING MATERIALS

(75) Inventors: Jerome Noiray, Leuven (BE); Ernst H. A. Granneman, Hilversum (NL)

(73) Assignee: ASM International N.V., Almere (NL)

( * ) Notice: Subject to any disclaimer, the term of this patent is extended or adjusted under 35 U.S.C. 154(b) by 715 days.

(21) Appl. No.: 12/701,407

(22) Filed: Feb. 5, 2010

(65) Prior Publication Data

US 2010/0210117 A1   Aug. 19, 2010

Related U.S. Application Data

(60) Provisional application No. 61/152,609, filed on Feb. 13, 2009.

(51) Int. Cl.
| | | |
|---|---|---|
| H01L 21/316 | (2006.01) | |
| H01L 21/3105 | (2006.01) | |
| H01L 21/28 | (2006.01) | |
| H01L 21/321 | (2006.01) | |

(52) U.S. Cl.
CPC .... *H01L 21/28176* (2013.01); *H01L 21/28211* (2013.01); *H01L 21/28247* (2013.01); *H01L 21/3105* (2013.01); *H01L 21/321* (2013.01)
USPC ............. 438/770; 257/E21.285; 438/773

(58) Field of Classification Search
CPC .............. H01L 21/28176; H01L 21/28211; H01L 21/28247; H01L 21/321; H01L 21/32105; H01L 21/3105
USPC ............ 438/770, 773; 257/E21.285
See application file for complete search history.

(56) References Cited

U.S. PATENT DOCUMENTS

| | | | | |
|---|---|---|---|---|
| 653,440 | A | * | 7/1900 | Clark ............................ 5/612 |
| 4,505,028 | A | * | 3/1985 | Kobayashi et al. ........... 438/301 |
| 4,906,595 | A | * | 3/1990 | van der Plas et al. ......... 438/439 |
| 5,008,160 | A | | 4/1991 | Jenkin |

(Continued)

FOREIGN PATENT DOCUMENTS

| | | |
|---|---|---|
| JP | 58-123866 | 7/1983 |
| JP | 12-04448 | 8/1989 |

(Continued)

OTHER PUBLICATIONS

Audisio, "Chemical Vapor Deposition of Tin on Iron or Carburized Iron," J. Electrochem Soc., Oct. 1980, pp. 2299-2304, vol. 127, Issue 10, Laboratoire de Physicochimie Industrielle, Institut National des Sciences Appliquees de Lyon, Villeurbanne Cedex, France.

(Continued)

*Primary Examiner* — Mary Wilczewski
(74) *Attorney, Agent, or Firm* — Knobbe, Martens, Olson & Bear LLP

(57) ABSTRACT

Oxygen is selectively removed from metal-containing materials in a partially-fabricated integrated circuit. In some embodiments, the partially-fabricated integrated circuit has exposed silicon and metal-containing materials, e.g., as part of a transistor. The silicon and metal-containing material are oxidized. Oxygen is subsequently removed from the metal-containing material by an anneal in an atmosphere containing a reducing agent. Advantageously, the silicon oxide formed by the silicon oxidation is maintained while oxygen is removed from the metal-containing material, thereby leaving a high quality metal-containing material along with silicon oxide.

6 Claims, 5 Drawing Sheets

(56) References Cited

U.S. PATENT DOCUMENTS

| | | | |
|---|---|---|---|
| 5,132,756 A | 7/1992 | Matsuda | |
| 5,352,656 A | 10/1994 | Lackey et al. | |
| 5,518,061 A | 5/1996 | Newkirk et al. | |
| 5,545,578 A | 8/1996 | Park et al. | |
| 5,589,421 A | 12/1996 | Miyashita et al. | |
| 5,604,140 A * | 2/1997 | Byun | 438/253 |
| 5,756,392 A | 5/1998 | Lu et al. | |
| 5,810,929 A * | 9/1998 | Yuuki | 118/697 |
| 5,814,556 A | 9/1998 | Wee et al. | |
| 5,821,172 A * | 10/1998 | Gilmer et al. | 438/769 |
| 5,834,068 A | 11/1998 | Chern et al. | |
| 5,872,017 A | 2/1999 | Boydston et al. | |
| 5,907,188 A * | 5/1999 | Nakajima et al. | 257/751 |
| 5,916,378 A | 6/1999 | Bailey et al. | |
| 5,985,691 A | 11/1999 | Basol et al. | |
| 6,037,273 A * | 3/2000 | Gronet et al. | 438/773 |
| 6,162,741 A * | 12/2000 | Akasaka et al. | 438/773 |
| 6,165,883 A * | 12/2000 | Hiura | 438/592 |
| 6,180,542 B1 | 1/2001 | Hwang | |
| 6,193,911 B1 | 2/2001 | Hunt et al. | |
| 6,197,702 B1 | 3/2001 | Tanabe et al. | |
| 6,204,204 B1 | 3/2001 | Paranjpe et al. | |
| 6,228,752 B1 * | 5/2001 | Miyano | 438/592 |
| 6,265,297 B1 | 7/2001 | Powell | |
| 6,277,722 B1 * | 8/2001 | Lee et al. | 438/592 |
| 6,284,634 B1 * | 9/2001 | Rha | 438/592 |
| 6,306,756 B1 | 10/2001 | Hasunuma et al. | |
| 6,310,327 B1 | 10/2001 | Moore et al. | |
| 6,410,456 B1 * | 6/2002 | Gronet et al. | 438/769 |
| 6,425,951 B1 | 7/2002 | Chu et al. | |
| 6,458,714 B1 | 10/2002 | Powell et al. | |
| 6,500,350 B1 | 12/2002 | Hunt et al. | |
| 6,503,819 B2 * | 1/2003 | Tanabe et al. | 438/591 |
| 6,599,821 B2 * | 7/2003 | Lee | 438/592 |
| 6,680,516 B1 * | 1/2004 | Blosse et al. | 257/412 |
| 6,734,102 B2 | 5/2004 | Rathi et al. | |
| 6,734,531 B2 | 5/2004 | Weimer et al. | |
| 6,743,473 B1 | 6/2004 | Parkhe et al. | |
| 6,764,961 B2 | 7/2004 | Ku et al. | |
| 6,803,321 B1 * | 10/2004 | Blosse et al. | 438/740 |
| 6,835,672 B1 * | 12/2004 | Park et al. | 438/770 |
| 6,858,524 B2 | 2/2005 | Haukka et al. | |
| 6,890,867 B2 * | 5/2005 | Powell | 438/770 |
| 6,916,744 B2 * | 7/2005 | Achutharaman et al. | 438/694 |
| 6,951,780 B1 * | 10/2005 | Herner | 438/128 |
| 7,015,151 B2 * | 3/2006 | Powell | 438/770 |
| 7,022,541 B1 | 4/2006 | Yenilmez et al. | |
| 7,049,187 B2 * | 5/2006 | Yamamoto et al. | 438/197 |
| 7,094,637 B2 * | 8/2006 | Storbeck et al. | 438/192 |
| 7,109,104 B2 * | 9/2006 | Ku et al. | 438/592 |
| 7,129,188 B2 * | 10/2006 | Powell | 438/770 |
| 7,186,623 B2 * | 3/2007 | Nitta et al. | 438/309 |
| 7,186,632 B2 * | 3/2007 | Ogawa et al. | 438/585 |
| 7,211,508 B2 | 5/2007 | Chung et al. | |
| 7,238,595 B2 | 7/2007 | Brabant et al. | |
| 7,288,205 B2 | 10/2007 | Lakshmanan et al. | |
| 7,435,665 B2 | 10/2008 | Airaksinen et al. | |
| 7,550,353 B2 * | 6/2009 | Lee et al. | 438/288 |
| 7,678,678 B2 * | 3/2010 | Gonzalez et al. | 438/592 |
| 7,736,963 B2 | 6/2010 | Lee et al. | |
| 7,829,457 B2 * | 11/2010 | Yoshimi et al. | 438/635 |
| 8,569,828 B2 * | 10/2013 | Yaegashi | 257/324 |
| 2001/0025971 A1 * | 10/2001 | Powell | 257/288 |
| 2002/0052124 A1 | 5/2002 | Raaijmakers et al. | |
| 2002/0092584 A1 | 7/2002 | Soininen et al. | |
| 2003/0173347 A1 | 9/2003 | Guiver | |
| 2004/0029364 A1 | 2/2004 | Aoki et al. | |
| 2004/0047993 A1 | 3/2004 | Kumar et al. | |
| 2004/0154185 A1 | 8/2004 | Morad et al. | |
| 2006/0060137 A1 | 3/2006 | Hasper et al. | |
| 2006/0115984 A1 | 6/2006 | Park et al. | |
| 2006/0156970 A1 | 7/2006 | Dong-Suk et al. | |
| 2006/0240680 A1 | 10/2006 | Yokota et al. | |
| 2006/0252258 A1 | 11/2006 | Wu et al. | |
| 2007/0259111 A1 | 11/2007 | Singh et al. | |
| 2008/0054326 A1 | 3/2008 | Wong et al. | |
| 2009/0269939 A1 | 10/2009 | Sprey | |

FOREIGN PATENT DOCUMENTS

| | | | | |
|---|---|---|---|---|
| JP | 2-25559 | * | 1/1990 | C23C 8/24 |
| JP | 06-151815 | | 5/1994 | |
| JP | 2001-262378 | | 9/2001 | |
| JP | 2003-318120 | | 11/2003 | |
| JP | 2006-93653 | | 4/2006 | |
| JP | 2006-196910 | | 7/2006 | |
| JP | 2007-77455 | | 3/2007 | |
| JP | 2007-142237 | | 6/2007 | |
| WO | WO 93/19222 | | 9/1993 | |

OTHER PUBLICATIONS

Behner, "Surface composition of CVD-grown a-SiC layers—an XPS and LEED study," Applied Surface Science, May 1996, pp. 27-33, vol. 99, Issue 1.

Champeaux, "In situ growth of YBaCuO superconducting thin films by excimer laser ablation: influence of deposition and cooling parameters," Applied Surface Science, May 1993, pp. 335-339, vol. 69, Issues 1-4.

Chen et al., "Oxidation behavior of titanium nitride films," J. Vac. Sci. Technol. A 23(4), pp. 1006-1009 (Jul./Aug. 2005).

Frohlich, "Characterization of rare earth oxides based MOSFETS gate stacks prepared by metal-organic chemical vapour deposition," Materials Science in Semiconductor Processing, Dec. 2006, pp. 1065-1072, vol. 9, Issue 6.

Galata, "Post deposition annealing studies of lanthanum aluminate and ceria high-k dielectrics on germanium," Microelectronics Reliability, Apr.-May 2007, pp. 532-535, vol. 47, Issues 4-5.

Lu, "A Novel Process for Fabricating Conformal and Stable TiN-Based Barrier Films," J. Electrochem Soc., Dec. 1996, pp. L279-L280, vol. 143; Issue 12, Texas Instruments, Dallas, Texas, United States.

Mori, "Effect of Ambient on the Surface Resistance of Diamond Films during Cooling after Deposition," Japanese Journal of Applied Physics, 1992, pp. L1718-L1720, vol. 31, Osaka University, 2-1 Yamada-oka, Suita, Osaka 565.

Reitmeier, "In situ cleaning of GaN(0001) surfaces in a metalorganic vapor phase epitaxy environment," J. Vac. Sci. Technol., Sep. 2004, p. 2077-2082, vol. 22, Issue 5, North Carolina State University, Raleigh, North Carolina, United States.

Saha et al., "Titanium nitride oxidation chemistry: An x-ray photoelectron spectroscopy study," J. Appl. Phys. 72 (7), pp. 3072-3079 (Oct. 1, 1992).

Tenne, "Characterization of oriented thin films of WSe2 grown by van der Waals rheotaxy," Thin Solid Films, Jan. 1996, pp. 38-42, vol. 272, Issue 1.

Verrelli, "Deposition and electrical characterization of hafnium oxide films on silicon," Physica status solidi, pp. 3720-3723, vol. 5, Issue 5, Greece.

Yamamoto et al., "Thermal Stability of Nitrogen in WNx Barriers Applied to Polymetal Gates," J. Vac. Soc. Technol. B. 23(4), pp. 1664-1673 (Jul./Aug. 2005).

Yim, "Dependence of the electrical and optical properties of sputter-deposited ZnO: Ga films on the annealing temperature, time, and atmosphere," Journal of Materials Science: Materials in Electronics, Apr. 2007, pp. 385-390, vol. 18, No. 4, Kluwer Academic Publishers, Inha University, Inchon, South Korea.

* cited by examiner

FIG. 4

| Exp. | Process | Selective Oxidation | | | | | | | NH3 anneal (POA means Post Oxidation Anneal) | | | | Resistivity Rs,post/Rs,pre |
|---|---|---|---|---|---|---|---|---|---|---|---|---|---|
| | | Temp (C) | H2O part. Press. (Torr) | H2 flow (slm) | N2 flow (slm) | NH3 flow (slm) | Total flow (slm) | Time (hrs) | H2 flow (slm) | N2 flow (slm) | NH3 flow (slm) | Time | |
| 1 | Sel. Ox. *) & NH3 POA in-situ | 850 | 2.5 | 6 | 1 | 0 | 7 | 6 | 6 | 1 | 0.1 | 40 min | 0.65 |
| 2 | Sel. Ox. & NH3 POA in-situ | 850 | 0.64 | 6 | 1 | 0 | 7 | 6 | 6 | 1 | 0.1 | 40 min | 0.42 |
| 3 | Sel. Ox. & NH3 POA ex situ | 900 | 0.14 | 20 | 5 | 0 | 25 | 3 | 20 | 4.9 | 0.1 | 30 min | 0.22 |
| 4 | Sel. Ox. with NH3 added | 900 | 0.14 | 20 | 4.5 | 0.5 | 25 | 3 | - | - | - | 0 min | 0.20 |
| 5 | NH3 anneal, no Sel. Ox. (Fig. 1) | 900 | - | - | - | - | - | - | 20 | 2.5 | 2.5 | 3 hrs | No data |

US 8,889,565 B2

SELECTIVE REMOVAL OF OXYGEN FROM METAL-CONTAINING MATERIALS

REFERENCE TO RELATED APPLICATIONS

This application claims the priority benefit under 35 U.S.C. §119(e) of provisional Application No. 61/152,209, filed Feb. 13, 2009.

This application is related to Co-pending application Ser. No. 12/701,422, filed on even date herewith, entitled SELECTIVE OXIDATION PROCESS.

BACKGROUND

1. Field of the Invention

This application relates to semiconductor processing and, more particularly, to the removal of oxygen from metal-containing materials, such as metal nitrides.

2. Description of the Related Art

Semiconductor device fabrication is a complex process. Devices are typically formed on a semiconductor substrate, and often include conductive elements separated by insulating elements. Conductive elements may serve as electrodes and interconnecting conductors, and may be formed from materials such as polysilicon, metal or metal nitride.

Various electronic devices, such as transistor devices, exist in the modern day fabrication of integrated circuits, with metal-oxide-semiconductor field-effect transistors (MOSFET) being a common transistor device. Generally, a MOSFET includes a conductive gate electrode formed over a gate dielectric, which in turn overlies a semiconductor substrate that is typically single-crystal silicon. For reliable MOSFET performance, it is important to maintain the conductivity of the gate electrode, which may be composed of conductive materials such as metals or metal nitrides.

To achieve a MOSFET with desirable characteristics, oxidation is often performed on certain components in a semiconductor device, such as to form dielectrics. For example, silicon oxide can be created by oxidizing a silicon substrate. Unfortunately, conditions during the oxidation of silicon materials often result in oxidation of exposed metals. For example, performing oxidation of a silicon substrate while a metal or metal nitride structure is exposed can result in a layer of metal oxide forming around the metal or metal nitride. This metal oxide layer consumes the desired metal or metal nitride, reducing the conductive metal volume available for conducting current. As dimensions continually scale down, oxidation could effectively destroy the metal or metal nitride.

Since the metals and metal nitride may be readily oxidized to a point that its overall resistance is increased beyond useable levels, there is a need for selective oxidation. Selective oxidation employs methods that form the desired oxide components while at the same time minimize or preclude oxidation of, or oxide formation in, other components whose properties may be adversely affected by oxidation. Methods exist for selective oxidation that can effectively protect tungsten and molybdenum while oxidizing silicon. However, known selective oxidation techniques, such as use of dilute water vapor in $H_2$ gas, while effective for preventing oxidation of tungsten, are ineffective at the protection of other metals or metal nitrides such as titanium and titanium nitride.

Accordingly, there is a need for processes directed to maintaining the integrity of exposed metal-containing parts, such as transition metal or transition metal nitride structures, while forming desired oxides in other exposed parts.

SUMMARY

According to some embodiments of the invention, a method for selective oxidation is provided. The method comprises providing a partially-fabricated integrated circuit in a processing chamber. The partially-fabricated integrated circuit includes an exposed metal-containing portion and an exposed silicon portion. The partially-fabricated integrated circuit is exposed to an oxidant to convert at least a part of the exposed silicon portion to silicon oxide. Subsequently, the partially-fabricated integrated circuit is annealed while exposing the metal-containing portion and the silicon oxide converted from the silicon portion to a reducing agent.

According to some other embodiments of the invention, a method for semiconductor processing is provided. The method comprises providing a partially-fabricated integrated circuit in a processing chamber. The partially-fabricated integrated circuit includes an exposed metal nitride portion. The partially-fabricated integrated circuit is annealed while exposing the metal-nitride portion to a reducing agent. An oxygen concentration in the metal-nitride is reduced after the anneal.

BRIEF DESCRIPTION OF THE DRAWINGS

Various features, aspects and advantages of the various devices, systems and methods presented herein are described with reference to drawings of certain embodiments, which are intended to illustrate, but not to limit, such devices, systems, and methods. It is to be understood that the attached drawings are for the purpose of illustrating concepts of the embodiments discussed herein and may not be to scale.

FIG. 4 Shows an oxygen SIMS plot of TiN subjected to 2 different selective oxidation conditions and an anneal treatment comprising $NH_3$.

DETAILED DESCRIPTION

Bulk metal-containing portions of partially-fabricated integrated circuits can include parts of the electronic devices, e.g., gate electrodes for transistors. In some applications, the bulk metal containing portions comprise bulk metal nitrides. In other applications, the bulk metal containing portions can comprise 80% or more metal.

According to some embodiments of the invention, methods are provided for selectively oxidizing silicon portions of a partially-fabricated integrated circuit relative to metal-containing portions of the partially-fabricated integrated circuit. After subjecting the partially-fabricated integrated circuit to an oxidation process, oxygen is selectively removed from the metal-containing portions by an anneal utilizing a reducing agent, e.g., as a gas flowed, during the anneal, into a processing chamber containing the partially-fabricated integrated circuit.

In some embodiments, silicon is selectively oxidized relative to a metal or metal nitride, such as titanium nitride (TiN). The selective oxidation process includes first oxidizing the silicon, which may also cause some oxidation of the metal-containing material, and subsequently annealing the silicon and the metal-containing material in a post oxidation anneal. The metal-containing material is exposed to a reducing agent during the anneal. The reducing agent has been found to reduce the oxygen content in the metal-containing material, while the high quality silicon oxide formed by oxidizing the silicon is maintained at a desired thickness.

Advantageously, by achieving a low oxygen content in the metal nitride films, metal nitride films with a low sheet resistance can be realized. In some embodiments, the oxygen content in a TiN film is about 2 atomic percent (at. %) or less, about 1-2 at. %, or about 1.0 at. % or less after being annealed, thereby forming a TiN film with an advantageously low sheet resistance.

Various reducing agents can be provided in the process chamber during the post oxidation anneal. Examples of reducing agents including nitrogen-containing reducing agents, such as $NH_3$, hydrazine, and hydrazine derivatives. Other examples of reducing agents include organic reducing agents, which preferably have at least one functional group selected from the group consisting of an alcohol group (—OH), an aldehyde group (—CHO), and a carboxylic acid group (—COOH).

Reference will now be made to the Figures, in which like numerals refer to like parts throughout. It will be appreciated that the selective oxidation process disclosed herein is applicable to various structures having exposed silicon and metal-containing portions. In some particularly advantageous embodiments, the structures have exposed silicon adjacent exposed TiN.

Figure 1:
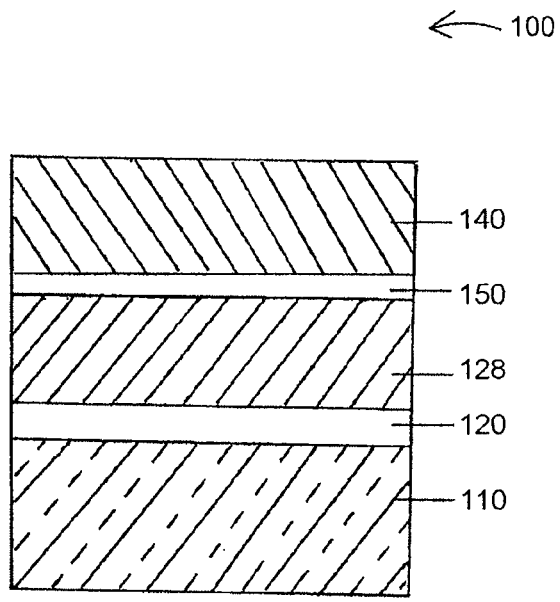
FIG. 1 is a schematic cross-sectional view of a partially-formed semiconductor device, according to some embodiments of the invention.

With reference to FIG. 1, the structure having exposed silicon and metal-containing portions can include a transistor gate stack overlying a silicon substrate. The illustrated embodiment provides a method of selective oxidation on a gate electrode structure having a lower and an upper electrode. The upper electrode includes a transition metal, e.g., titanium, and in the illustrated embodiment may consist essentially of transition metal nitride, e.g., titanium nitride.

FIG. 1 illustrates a schematic cross-sectional view of a partially-fabricated integrated circuit 100. The partially-fabricated integrated circuit 100 includes a plurality of semiconductor device layers including a silicon semiconductor substrate 110, a gate dielectric layer 120, a conductive layer 128 for use as a lower electrode and a transition metal/metal nitride layer 140 for use as an upper electrode. The silicon semiconductor substrate 110 is typically formed on or is part of a silicon wafer. The gate dielectric 120 can be silicon oxide, a high k material, or multi-layer combinations of different dielectric materials. In one embodiment, and as shown in FIG. 1, a conductive layer 128, formed of polysilicon, metal, metal alloys or metal silicide, is formed over the gate dielectric layer 120 for use as a lower electrode. The transition metal/metal nitride layer 140 is formed over the conductive layer 128 for use as an upper electrode. In some embodiments, layer 140 has a thickness between about 5 nm and about 100 nm. In one embodiment, layer 140 has a thickness of approximately 20 nm. With the layers shown in FIG. 1, a MOSFET device can be established having gate, source and drain regions, by depositing and etching appropriate materials and injecting appropriate dopants into selected regions, as known in the art.

In some embodiments, additional conductive or insulating layers may be provided. For example, with continued reference to FIG. 1, a diffusion barrier 150 can be provided between layer 140 and the conductive layer 128. The diffusion barrier 150 can be a non-reactive, thin conductive film that acts as a diffusion barrier between the different materials forming the upper and lower electrodes 144, 130 (FIG. 2).

Figure 2:
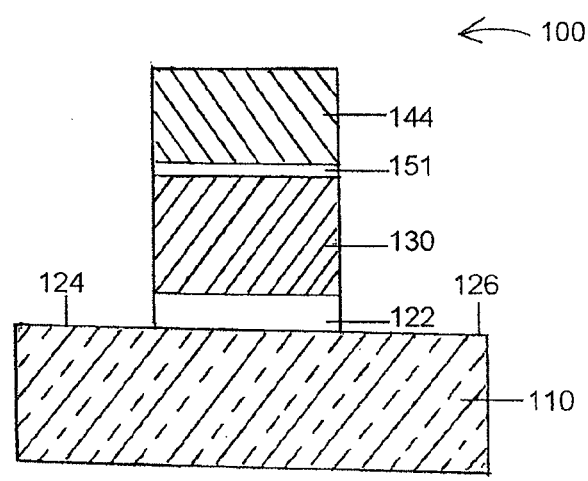
FIG. 2 is a schematic cross-sectional view of the partially-formed semiconductor device of FIG. 1 after subjecting the device to a patterning process, according to some embodiments of the invention.

FIG. 2 illustrates the partially-fabricated integrated circuit 100 of FIG. 1 after masking and etching the stacked layers to form a gate stack. After etching to form the gate stack, any overlying mask, if present, is removed. Thus, the etch forms an upper gate electrode 144, an etched diffusion barrier 151, a lower gate electrode 130, and an etched gate dielectric 122.

After etching the partially-fabricated integrated circuit 100, exposed silicon is oxidized. As shown in FIG. 2, the silicon substrate 110 has exposed silicon areas 124, 126 that may be damaged by the etch process. Oxidizing these areas can repair the surface silicon, where the source or drain areas of the transistor may also be located. In some cases, the exposed silicon areas 124, 126 may have overlying dielectric layers (not illustrated), such as silicon oxide layers, which were damaged during the etching process. The overlying dielectric can be re-oxidized to repair the dielectric, or a lower interfacial oxide can be grown through the dielectric. In some embodiments, oxidation of other areas besides the exposed silicon substrate can be desired as well, including the lower electrode 130.

Figure 3:
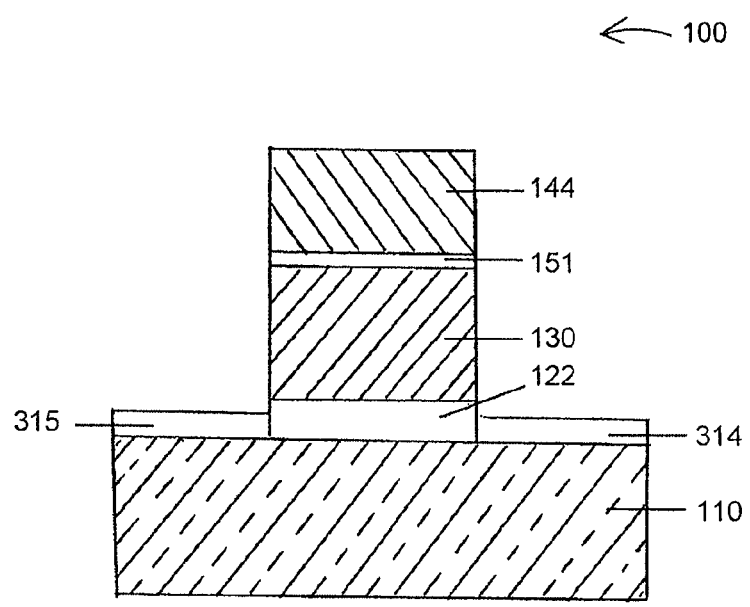
FIG. 3 is a schematic cross-sectional view of the partially-formed semiconductor device of FIG. 2 after subjecting the device to an oxidation process, according to some embodiments of the invention.

With reference to FIG. 3, the partially-fabricated integrated circuit 100 is subsequently subjected to a selective oxidation process. In some embodiments, the exposed silicon areas 124, 126 and the exposed upper electrode are exposed to an oxidizing agent that includes water vapor. Water vapor preferentially oxidizes the silicon areas 124, 126 to form silicon oxide (e.g., thermal $SiO_2$) layers 314, 315 while the conductive metal or metal nitride is only slightly oxidized.

In one embodiment, the silicon is at a temperature between about 550° C. and about 900° C., and more preferably between about 650° C. and about 850° C. during the oxidation. In a preferred embodiment, the oxidation takes place at about 750° C. The oxidation may take place in a chamber having a water vapor concentration in a range between about 0.0005% and about 90% by volume, diluted in hydrogen, with a higher water vapor pressure resulting in enhanced oxidation but a lower preference for oxidizing silicon related to metal-containing materials. A preferred oxidant mixture includes about 0.05 vol. % to about 20 vol. % water vapor diluted in hydrogen. Depending on conditions in the process chamber, such as temperature and pressure, the duration of the oxidation may be between about 2 minutes and about 240 minutes. In one embodiment, oxidation takes place for 30 minutes in a chamber at 750° C., resulting in a silicon oxide layer 314 that has a thickness between about 20 Å and about 30 Å formed on the exposed silicon.

In some embodiments of the invention, upper electrode 144 consists primarily of a metal but is covered on the outside with a protective layer of metal nitride since metal nitrides can better withstand selective oxidation conditions than the pure metals. The protective metal nitride film can be formed by nitridation of the metal electrode in a nitrogen-containing ambient, or can be deposited by a deposition method such as CVD, ALD or PVD.

In accordance with some embodiments of the invention, oxygen can be selectively removed from the upper electrode 144 relative to the silicon oxide layer 314, 315 thereby reducing the sheet resistivity of the upper electrode 144. After forming the silicon oxide layer 314, 315 the partially-fabricated integrated circuit 100 is subjected to a post oxidation anneal. During the anneal, the upper electrode 144 is exposed to a reducing agent. The reducing agent is preferably selected such that reaction by-products are volatile and can be easily removed from the processing chamber.

Without being limited by theory, it is believed that the oxygen atoms on the metal/metal nitride surface, e.g., a TiN surface, react with the reducing agent to form the volatile species, which can be removed from the processing chamber. The reducing agent can dissociate on the metal/metal nitride surface, thereby forming a reactive species. The reactive species reacts with oxygen on the surface to form a volatile fragment that desorbs from the surface. The oxygen atoms in the metal/metal nitride, e.g., TiN, are believed to have a high diffusion coefficient. The lower concentration of oxygen on the surface draws additional oxygen atoms from within the metal/metal nitride to the metal/metal nitride surface, where more oxygen reacts with the reducing agent and is volatilized. Thus, the high mobility of oxygen atoms in the metal/metal nitride and the volatilization of oxygen on the metal/metal nitride surface can allow substantially all the oxygen in the metal/metal nitride to be drawn out and removed.

Figure 5:
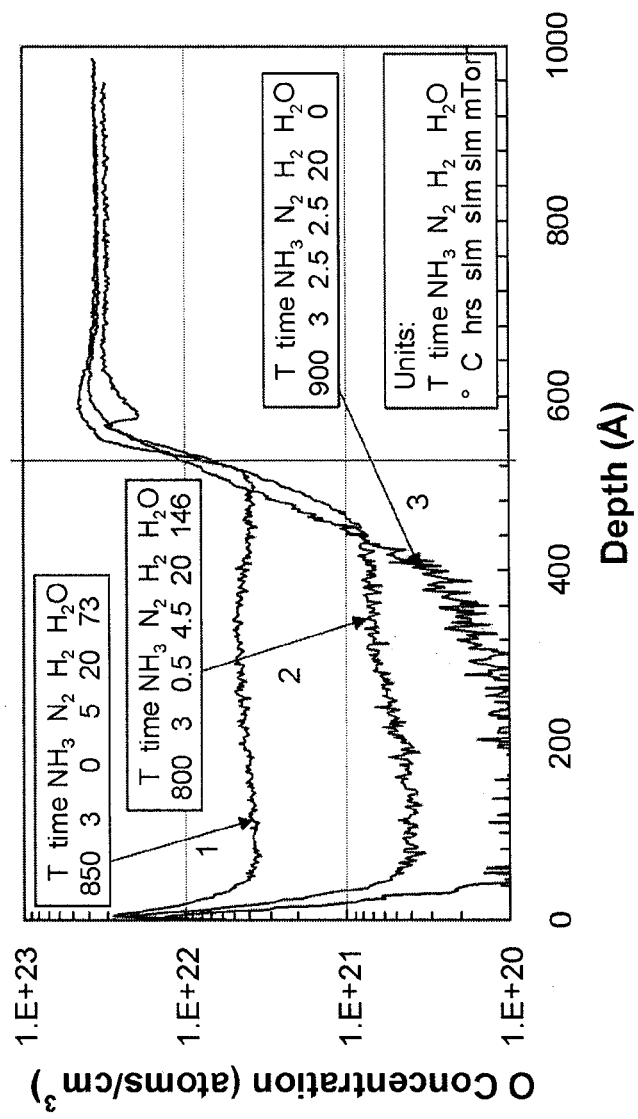
FIG. 5 is a table showing various (selective) oxidation and Post Oxidation Anneal parameters as discussed below regarding Example 1.

FIG. 5 provides experimental evidence for the theory above. The figure shows SIMS profiles for a substrate comprising a 45 nm PVD TiN layer deposited on $SiO_2$, wherein the TiN layer was subjected to three different treatments. The TiN layer surface is represented at the left axis of the graph and the interface TiN/$SiO_2$ is represented at the vertical line drawn at about 530 Å. In treatment 1, the substrate was subjected to selective oxidation conditions at 850° C., in a mixture of $N_2$ and $H_2$, with a partial pressure of 73 mTorr $H_2O$. As a result, a relatively flat oxygen concentration of $4 \times 10^{21}$ is measured throughout the film.

In treatment 2, the substrate was subjected to selective oxidation conditions at 800° C. in a mixture of $N_2$ and $H_2$, but this time also with $NH_3$ added. The $H_2O$ partial pressure was in this case 146 mTorr. Now a relatively flat oxygen concentration of about $5 \times 10^{20}$ is achieved. This is believed to be due to the addition of $NH_3$ resulting in a strong improvement of the selectivity of the process and preventing the oxidation of TiN, as described in Co-pending application Ser. No. 12/701,422, filed on even date herewith, entitled SELECTIVE OXIDATION PROCESS.

In the third treatment, no oxidant was added and the substrate was only subjected to a treatment at 900° C. in an ambient comprising $NH_3$. In this case the lowest concentration oxygen was measured, about $1 \times 10^{20}$. Towards the interface with $SiO_2$ the oxygen concentration increases, most likely due to a solid state reaction between the TiN and the $SiO_2$. The relatively flat oxygen profiles throughout the layer demonstrate that oxygen can readily diffuse through the TiN layer.

Advantageously, oxygen in the silicon oxide formed by the oxidation process is not significantly affected by the anneal. Without being limited by theory, it is believed that the oxygen atoms in the silicon oxide are bonded to silicon atoms and are not readily volatized and/or drawn out by reaction with the reducing agent. Thus, a selective oxidation of the silicon is achieved; the silicon is oxidized to form silicon oxide having a desired thickness while the exposed metal nitride, TiN in the illustrated embodiment, has advantageously low levels of oxygen or is substantially free of oxygen.

In cases where the reducing agent is $NH_3$, the $NH_3$ may constitute between about 0.01 and about 20% by volume, more preferably between about 0.1% and about 10% by volume, and most preferably between about 0.2% and about 2% by volume of the flow of gas introduced into the processing chamber during the post oxidation anneal.

The duration of the anneal can be selected based upon the desired properties for the upper electrode 144 in view of, e.g., the thermal budget for the partially-fabricated integrated circuit 100.

In addition, it will be appreciated that the anneal temperature can be chosen based upon, among other things, the identity of the reducing agent, the desired reactivity with exposed surfaces of the partially-fabricated integrated circuit 100, and the reactivity of chemical species within the partially-fabricated integrated circuit 100. For example, the anneal temperature can be chosen to prevent undesired decomposition of the reducing agent, and/or undesired reactions between chemical species within the partially-fabricated integrated circuit 100, while achieving sufficient reactivity between the reducing agent and the TiN passivation layer 215.

It has been found that anneal temperatures below about 850° C. provide a relatively uniform reduction of oxygen in the TiN film. In some embodiments, the amount of oxygen in the TiN film is reduced by an order of magnitude. At about 900° C. or above, the oxygen reduction in the bulk TiN is similar, but it has been found that the level of oxygen at the interface of the TiN and $SiO_2$ increased, e.g., by an order of magnitude relative to the oxygen level before the anneal. Without being limited by theory, it is believed that this increase is due to reaction between TiN and $SiO_2$ at their interface. In some embodiments, the anneal is performed at about 850° C. to achieve a relatively uniform oxygen distribution in the TiN film and guard against reactions between TiN and $SiO_2$.

In some embodiments, the reducing agent is a nitrogen-containing compound, e.g., $NH_3$. Examples of other nitrogen-containing reducing agents include hydrazine ($N_2H_4$), methylhydrazine ($N_2H_{4-n}(CH_3)_n$, n=1-4), ethyl hydrazine ($N_2H_{4-n}(C_2H_5)_n$, n=1-4), other organic hydrazines having carbon chains of 1 to 4 carbon atoms, saturated with hydrogen or one or more of the hydrogen atoms substituted by a halide and not containing oxygen, ammonia ($NH_3$) and any combination thereof.

In some other embodiments, the reducing agent is an organic reducing agent having at least one functional group selected from the group consisting of an alcohol group (—OH), an aldehyde group (—CHO), and a carboxylic acid group (—COOH). Advantageously, organic reducing agents can be chosen to be free of nitrogen, thereby preventing the nitridation of the oxidized semiconductor, as can occur during anneals with nitrogen-containing reducing agents.

To prevent undesired decomposition of the organic reducing compound, the anneal temperature can be about 400° C. or less, or about 300° C. or less, or about 200° C. or less, depending upon the resistance of the organic reducing agent to heat-induced decomposition. For example, in one embodiment, an anneal using ethanol can be performed at about 300° C. In another example, an anneal using acetic acid can be performed at about 180° C. Advantageously, the low anneal temperatures can permit the anneal to performed during the course of back end of line (BEOL) processes to remove oxygen from, e.g., metal nitrides such as TiN.

In some embodiments, reducing agents containing at least one alcohol group are selected from the group consisting of primary alcohols, secondary alcohols, tertiary alcohols, polyhydroxy alcohols, cyclic alcohols, aromatic alcohols, halogenated alcohols, and other derivatives of alcohols.

Examples of primary alcohols include alcohols having an —OH group attached to a carbon atom which is bonded to another carbon atom, such as primary alcohols according to the general formula (I):

$$R^1\text{—OH} \tag{I}$$

wherein $R^1$ is a linear or branched $C_1$-$C_{20}$ alkyl or alkenyl groups, preferably methyl, ethyl, propyl, butyl, pentyl or hexyl groups. Examples of primary alcohols include methanol, ethanol, propanol, butanol, 2-methyl propanol and 2-methyl butanol.

Examples of secondary alcohols include alcohols having an —OH group attached to a carbon atom that is bonded to two other carbon atoms, such as secondary alcohols having the general formula (II):

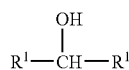
$$\tag{II}$$

wherein each $R^1$ is selected independently from the group of linear or branched $C_1$-$C_{20}$ alkyl and alkenyl groups, preferably methyl, ethyl, propyl, butyl, pentyl or hexyl groups. Examples of secondary alcohols include 2-propanol and 2-butanol.

Examples of tertiary alcohols include alcohols having an —OH group attached to a carbon atom that is bonded to three other carbon atoms, such as tertiary alcohols having the general formula (III):

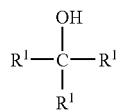
$$\tag{III}$$

wherein each $R^1$ is selected independently from the group of linear or branched $C_1$-$C_{20}$ alkyl and alkenyl groups, preferably methyl, ethyl, propyl, butyl, pentyl or hexyl groups. An example of a tertiary alcohol is tert-butanol.

Some examples of polyhydroxy alcohols, such as diols and triols, have primary, secondary and/or tertiary alcohol groups as described above. Examples of preferred polyhydroxy alcohol are ethylene glycol and glycerol.

Some examples of cyclic alcohols have an —OH group attached to at least one carbon atom which is part of a ring of 1 to 10, or 5-6 carbon atoms.

Examples of aromatic alcohols include aromatic alcohols having at least one —OH group attached either to a benzene ring or to a carbon atom in a side chain. Examples of aromatic alcohols include benzyl alcohol, o-, p- and m-cresol and resorcinol.

Examples of halogenated alcohols including alcohols having the general formula (IV):

$$CH_nX_{3-n}\text{—}R^2\text{—OH} \tag{IV}$$

wherein X is selected from the group consisting of F, Cl, Br and I, n is an integer from 0 to 2 and $R^2$ is selected from the group of linear or branched $C_1$-$C_{20}$ alkyl and alkenyl groups, such as methyl, ethyl, propyl, butyl, pentyl or hexyl groups. In some embodiments, X is selected from the group consisting of F and Cl and $R^2$ is selected from the group consisting of methyl and ethyl groups. An example of a preferred halogenated alcohol is 2,2,2-trifluoroethanol.

Other preferred derivatives of alcohols include amines, such as methyl ethanolamine.

Examples of reducing agents containing at least one aldehyde group (—CHO) include compounds selected from the group consisting of compounds having the general formula (V), alkanedial compounds having the general formula (VI), halogenated aldehydes and other derivatives of aldehydes.

Thus, in one embodiment the reducing agent is an aldehyde having the general formula (V):

$$R^3\text{—CHO} \tag{V}$$

wherein $R^3$ is selected from the group consisting of hydrogen and linear or branched $C_1$-$C_{20}$ alkyl and alkenyl groups, preferably methyl, ethyl, propyl, butyl, pentyl or hexyl groups. In some embodiments, $R^3$ is selected from the group consisting of methyl or ethyl groups. Examples of compounds according to formula (V) are formaldehyde, acetaldehyde and butyraldehyde.

In some other embodiments, the reducing agent is an aldehyde having the general formula (VI):

$$OHC\text{—}R^4\text{—CHO} \tag{VI}$$

wherein $R^4$ is a linear or branched $C_1$-$C_{20}$ saturated or unsaturated hydrocarbon. Alternatively, the aldehyde groups may be directly bonded to each other ($R^4$ is null or omitted).

Reducing agents containing at least one —COOH group may be selected from the group consisting of compounds of the general formula (VII), polycarboxylic acids, halogenated carboxylic acids and other derivatives of carboxylic acids.

Thus, in some embodiments the reducing agent is a carboxylic acid having the general formula (VII):

$$R^5\text{—COOH} \tag{VII}$$

wherein $R^5$ is hydrogen or a linear or branched $C_1$-$C_{20}$ alkyl or alkenyl group, such as methyl, ethyl, propyl, butyl, pentyl or hexyl, more preferably methyl or ethyl groups. Examples of compounds according to formula (VII) are formic acid and acetic acid.

It will be appreciated that the various reducing agents disclosed herein can be used singly during the post oxidation anneal or in combination with one another.

EXAMPLE

Substrates having 45 nm thick PVD blanket TiN films deposited on $SiO_2$ and bare Si substrates were subjected to an oxidation process and subsequently to a post oxidation anneal. Although these TiN films are thicker than the films normally used in typical actual devices, they allowed SIMS thickness profiles to be measured which can provide information about the oxidation mechanism.

For each process condition, a plurality of substrates was loaded into an A412™ batch reactor, commercially available from ASM International, N.V. of Almere, the Netherlands. The substrates were oxidized using the conditions shown in FIG. 4, under the heading "Selective Oxidation." The substrates where subjected to an oxidation using $H_2O$ as the oxidant. The substrates were subsequently annealed using the conditions shown in FIG. 4, under the heading "Post Oxidation Anneal." $NH_3$ was used as the reducing agent during the anneals. The oxidation and the post oxidation anneal were performed isothermally, at the listed temperatures.

The sheet resistivity $R_s$ of the TiN was measured both before the oxidation ($R_{s\text{-}pre}$) and after the oxidation or after the oxidation and anneal ($R_{s\text{-}post}$) where a post oxidation anneal was performed. The ratio of the post anneal $R_s$ to the pre-anneal $R_s$ was determined. First it was observed that annealing the TiN films in a $N_2/H_2$ mixture for 3 hours at 900° C. resulted in a ratio $R_{s,post}/R_{s,pre}$ of 0.16. It is believed that this is due to the PVD TiN being cured by the anneal, resulting in lower resistivity. In Experiment #4, a selective oxidation was performed while $NH_3$ was added during the selective oxidation process to prevent oxidation of the TiN. This resulted in a ratio $R_{s,post}/R_{s,pre}$ of 0.2. In Experiment #3, an equal $H_2O$ partial pressure was used as in Experiment #4 but no $NH_3$ was added during oxidation. Consequently, some oxidation of the TiN occurred. The oxygen was removed from the TiN by the Post Oxidation Anneal with $NH_3$. It can be noticed from FIG. 4, that Experiment #3 resulted in a marginally higher $R_{s,post}/R_{s,pre}$ ratio than Experiment #4. This indicates that allowing the TiN to be slightly oxidized and removing the oxygen from the TiN by a reducing Post Oxidation Anneal with some $NH_3$ gas present works about as well as preventing oxidation of the TiN by addition of $NH_3$ gas during the selective oxidation. For Experiments #2 and #1 with increasingly more severe oxidation conditions, the $R_{s,post}/R_{s,pre}$ ratio increases with increasing $H_2O$ partial pressure. This indicates that, for these experiments, the Post Oxidation Anneal is still able to remove oxygen, although some residual oxygen still remains in the TiN.

Co-pending application Ser. No. 12/701,422, filed on even date herewith, entitled SELECTIVE OXIDATION PROCESS, describes a process for selective oxidation of exposed silicon relative to exposed TiN by flowing a reducing agent into the process chamber with the oxidant. Advantageously, as shown for Experiments #3 and #4, a post oxidation anneal with a reducing agent (Experiment #3) is roughly as effective in reducing the sheet resistance of TiN as oxidizing the silicon and exposed TiN in an atmosphere containing $NH_3$ (Experiment #4).

Figure 6:
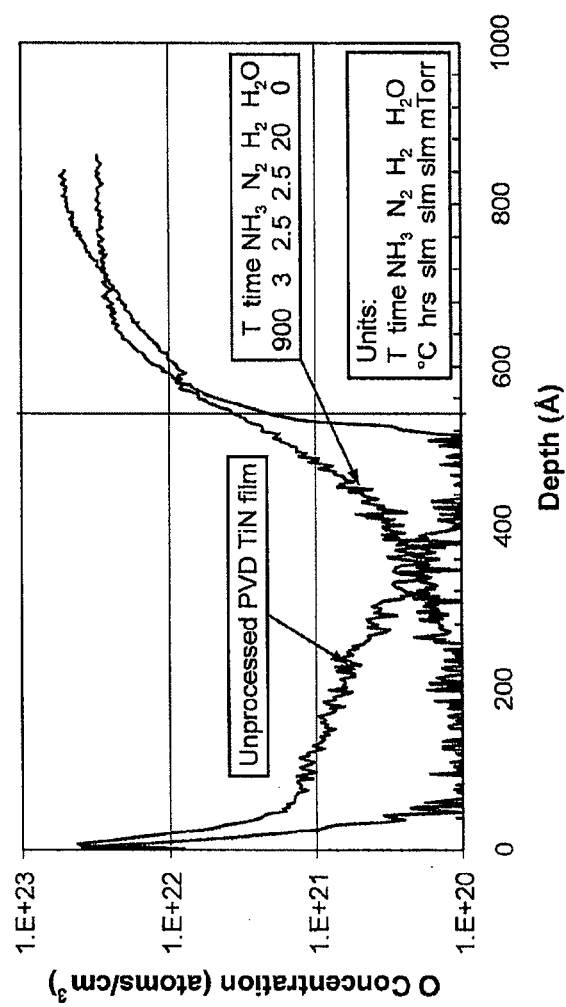
FIG. 6 shows an oxygen SIMS plot of TiN processed according to an embodiment of the invention.

With continued reference to FIG. 4, in experiment #5, the TiN was exposed to an anneal in an atmosphere containing $NH_3$ without first performing an oxidation. With reference to FIG. 6, the annealed TiN was analyzed and the oxygen SIMS plot of FIG. 6 was obtained. Also shown in FIG. 6 is the oxygen SIMS plot for TiN on substrates (identified as unprocessed TiN films) that have not been subjected to the oxidation or the anneal with a reducing agent. Advantageously, it can be seen that the annealed TiN has a lower oxygen content than the unprocessed TiN films for depths of about 350 Å or less, indicating that the anneal was effective at removing oxygen from the TiN film. In the top 200 Å of the TiN layer, the oxygen reduction is an order of magnitude or more. An advantage of some embodiments of the present invention is that the oxygen content of a metal-containing component in an integrated device structure can be reduced without the need to expose the structure to a plasma, which would lead to plasma-induced damage.

It will be appreciated that while the illustrated embodiments are discussed in the context of a partially-fabricated integrated circuit having transistor stack having a TiN layer, various other structures having exposed metal nitride and silicon portions may be selectively oxidized, so that silicon is selectively oxidized relative to a metal nitride. In some embodiments, a transistor stack may be provided having a TiN passivation layer (formed by methods described herein) instead of or in addition to one or more other TiN layers. The skilled artisan will also appreciate that other metal-containing layers, besides TiN, may benefit from the use of the anneal with a reducing agent, as described herein. For example, one skilled in the art will appreciate that a semiconductor structure having layers of other metals (including metal nitrides), in addition to or in place of TiN, may be used as well, including structures having tungsten nitride. For example, $TaN_x$, $WN_x$, $MoN_x$ and $NbN_x$ can be used instead of TiN as these nitrides have similar properties as TiN. Further, $VN_x$, $HfN_x$ and $ZrN_x$ can be considered. More generally, the invention can be applied to structures comprising transition metals and/or transition metal nitrides.

In addition, it will be appreciated that the transistor structure may, in some embodiments, include one or more conductive layers and insulating layers above a substrate, which typically includes silicon. The transistor structure may include a patterned gate structure wherein the titanium metal gate layer is formed over a gate dielectric. In some embodiments, the titanium metal gate layer may serve as a control gate above a "floating gate," often comprising polysilicon, which may store charge or data as part of a transistor memory device, such as a dynamic random access memory (DRAM) device or FLASH memory device.

Also, while advantageously applied directly after an oxidation to remove oxygen from metal nitrides, and referred to as a "post-oxidation" anneal for ease of description, it will be appreciated that the anneal using the reducing agent can be applied subsequent to the oxidation and temporally separated from the oxidation by one or more semiconductor fabrication processes. For example, the anneal can be performed during back end of line (BEOL) processing. In some cases, an oxidation, as discussed above regarding FIG. 3 is not performed before performing the anneal but unintentional oxidation of the metal or metal nitride electrode may occur during process steps subsequent to the metal or metal nitride deposition step. An anneal with the reducing agent can be used to remove oxygen present in the metal or metal nitride as a result of this unintentional oxidation.

Accordingly, it will be apparent to those skilled in the art that various modifications and variations can be made in the present invention without departing from the scope or spirit of the invention. Thus, it is intended that the present invention cover the modifications and variations of this invention provided that they come within the scope of the appended claims or their equivalents.

We claim:

1. A method for selective oxidation, comprising:
   providing a partially-fabricated integrated circuit in a processing chamber, wherein the partially-fabricated integrated circuit includes an exposed metal-containing portion and an exposed silicon portion;
   exposing the partially-fabricated integrated circuit to an oxidant to convert at least a part of the exposed silicon portion to silicon oxide; and
   subsequently annealing the partially-fabricated integrated circuit while exposing the metal-containing portion and the silicon oxide converted from the silicon portion to a reducing agent,
   wherein the reducing agent is selected from the group consisting of: $N_2H_4$; $(N_2H_{4-n}(CH_3)_n$, wherein n=1-4); $(N_2H_{4-n}(C_2H_5)_n$, wherein n=1-4); other organic hydrazines having carbon chains of 1 to 4 carbon atoms, saturated with hydrogen or one or more of the hydrogen atoms substituted by a halide and not containing oxygen; and combinations thereof.

2. A method for selective oxidation, comprising:
   providing a partially-fabricated integrated circuit in a processing chamber, wherein the partially-fabricated integrated circuit includes an exposed metal-containing portion and an exposed silicon portion;
   exposing the partially-fabricated integrated circuit to an oxidant to convert at least a part of the exposed silicon portion to silicon oxide; and
   subsequently annealing the partially-fabricated integrated circuit while exposing the metal-containing portion and the silicon oxide converted from the silicon portion to a reducing agent,
   wherein the reducing agent is an organic reducing agent.

3. The method of claim 2, wherein the organic reducing agent comprises at least one functional group selected from the group consisting of an alcohol (—OH), an aldehyde (—CHO), and a carboxylic acid (—COOH).

4. The method of claim 3, wherein the organic reducing agent with the alcohol group is selected from the group consisting of primary alcohols, secondary alcohols, tertiary alcohols, polyhydroxyalcohols, cyclic alcohols, and halogenated alcohols.

5. The method of claim 3, wherein the organic reducing agent with the aldehyde group is selected from the group consisting of:

compounds having the general formula $R^3$—CHO, wherein $R^3$ is hydrogen or a linear or branched $C_1$-$C_{20}$ alkyl or alkenyl group;

compounds having the general formula OHC—$R^4$—CHO, wherein $R^4$ is a linear or branched $C_1$-$C_{20}$ saturated or unsaturated hydrocarbon;

a compound of the formula OHC—CHO;

halogenated aldehydes; and other derivatives of aldehydes.

6. The method of claim 3, wherein the organic reducing agent with the carboxylic acid group is selected from the group consisting of:

compounds of the general formula $R^5$COOH, wherein $R^5$ is hydrogen or a linear or branched $C_1$-$C_{20}$ alkyl or alkenyl group;

polycarboxylic acids;

halogenated carboxylic acids; and other derivatives of carboxylic acids.

\* \* \* \* \*